United States Patent [19]
Pennino et al.

[11] Patent Number: 6,034,741
[45] Date of Patent: Mar. 7, 2000

[54] FUZZY LOGIC FILTER FOR IMPULSIVE NOISY IMAGES

[75] Inventors: Laura Pennino, Trieste; Rinaldo Poluzzi, Milan; Massimo Mancuso, Favara; Gianguido Rizzotto, Civate; Federico Travaglia, Milan, all of Italy

[73] Assignee: SGS-Thomson Microelectronics S.R.L., Agrate Brianza, Italy

[21] Appl. No.: 08/558,596

[22] Filed: Oct. 30, 1995

[30] Foreign Application Priority Data

Oct. 31, 1994 [EP] European Pat. Off. ............... 94830521

[51] Int. Cl.⁷ .................................................. H04N 5/21
[52] U.S. Cl. ............................................ 348/607; 382/261
[58] Field of Search .................................... 348/607, 608, 348/612, 618, 619, 620, 621, 622, 623, 624; 382/254, 260, 261, 275; 358/463, 455, 456; H04N 5/21

[56] References Cited

U.S. PATENT DOCUMENTS

| | | | |
|---|---|---|---|
| 5,245,445 | 9/1993 | Fujisawa | 358/458 |
| 5,621,474 | 4/1997 | Mancuso et al. | 348/606 |
| 5,659,370 | 8/1997 | Mancuso et al. | 382/260 |

FOREIGN PATENT DOCUMENTS 0 415 648  3/1991  European Pat. Off. ........ G06F 15/66

OTHER PUBLICATIONS

European search report from European Patent Application 94830521.4, filed Oct. 31, 1994.
Patent Abstracts of Japan, vol. 17, No. 445 (P–1539) Aug. 16, 1993 & JP–A–05 094 523 Yokogawa Medical Syst Ltd.
Patent Abstract of Japan, vol. 17, No. 427 (E–1413) Aug. 12, 1993 & JP–A–05 091 532 (Toshiba Corp).

*Primary Examiner*—Chris Grant
*Attorney, Agent, or Firm*—Wolf, Greenfield & Sacks, P.C.

[57] ABSTRACT

A filter performs a reduction of pulsed noise in video images in accordance with fuzzy logic. An interface circuit of the filter receives consecutive digital signals in time corresponding to the video images and generates an image window having a digital signal to be processed at the center. The filter also has a comparator block, a plurality of digital subtractors, and a memory circuit connected in cascade to the comparator block. The filter also has a filtering circuit that organizes values of digital signals of the video image, and an arithmetic block that performs a switch between the digital signal to be processed and the output of the filtering circuit on the basis of the values taken by the parameter.

26 Claims, 3 Drawing Sheets

FUZZY LOGIC FILTER FOR IMPULSIVE NOISY IMAGES

BACKGROUND OF THE INVENTION

1. Field of the Invention

The present invention relates to an electronic device used in video applications and specifically to a filter performing a reduction of pulsed noise in video images using fuzzy logic.

The present invention also relates to a method for performing a reduction of the pulsed noise in video images using fuzzy logic.

2. Discussion of the Related Art

As is known, in the field of television signal processing a very serious problem is generally that of reducing the effects caused by the presence of noise without reducing the signal part which contains useful data.

A typical type of noise present in video signals is pulsed noise. The effects of pulsed noise are such as to change the gray level of a so-called image pixel so as to cause a peak of luminosity (positive or negative) to appear in a nearly homogeneous image region.

The presence of pulsed noise also causes nearly white or nearly black dots in the image which in the sequence of moving images cause a so-called snowy effect.

In scientific literature there are many examples of filters using fuzzy logic to perform a selection among the signal parts containing useful data and the signal part containing noise so as to filter out only the noise.

The fuzzy procedures used by these filters are described, for example, in the articles "Fuzzy Operators for Sharpening of Noisy Images" by F. Russo and G. Ramponi in Electronics Letters Vol. 28 No. 18, August 1992, and "Working on Image Data Using Fuzzy Rules" by F. Russo and G. Ramponi in Signal Processing IV Theories and Applications, Proceedings of EUSIPCO-92, Brussels, Belgium August 1992.

Although advantageous in some ways, the filters described by these articles exhibit very complex architectures.

SUMMARY OF THE INVENTION

An illustrative embodiment of the present invention is a filter and an associated filtering method for performing a reduction of the pulsed noise contained in video images in accordance with fuzzy logic which would be structurally very simple while achieving a high quality of the filtered image.

One embodiment of the invention is directed to a filter for reducing pulsed noise in an image by using fuzzy logic. The filter comprises an interface circuit, having an input that receives a plurality of digital signals of the image that are consecutive in time including a digital signal to be processed, and an output that provides an image window having the digital signal to be processed at a center of the image window. The filter further comprises a plurality of subtractors, each having a first input that receives the digital signal to be processed, a second input that receives a respective one of the plurality of digital signals, and an output that provides a difference signal that represents a difference between the first input and the second input. The filter further comprises a comparator block, having a plurality of inputs each coupled to the output of one of the plurality of subtractors, and an output that provides a result of a comparison performed on the plurality of differences, a memory circuit, coupled to the output of the comparator block, that stores values of a fuzzy logic parameter, an output that provides a selected one of the values of the fuzzy logic parameter based upon the result output from the comparator block, a filtering circuit, having a plurality of inputs that each receives one of a group of the plurality of digital signals, and an output that provides one of the plurality of digital signals based upon an organization of the plurality of digital signals received at the plurality of inputs of the filtering circuit, and an arithmetic block, having a first input coupled to the output of the memory circuit, and a second input that receives the digital signal to be processed, a third input coupled to the output of the filtering circuit, the arithmetic block performing a switch between the digital signal to be processed and the output of the filtering circuit based upon the selected value of the fuzzy logic parameter.

Another embodiment of the invention is directed to a method for filtering pulsed noise within a video image, the video image including an image window that has a digital signal to be processed at a center of the image window, the image window being provided by an output of an interface circuit, the method further using an output of a filtering circuit. The method comprises the steps of selecting a fuzzy logic parameter value based upon the digital signal to be processed, and switching between the digital signal to be processed and the output of the filtering circuit based upon the value of the fuzzy logic parameter.

BRIEF DESCRIPTION OF THE DRAWINGS

The characteristics and advantages of the filter in accordance with the present invention and the associated filtering method are set forth in the description of an embodiment thereof given below by way of non-limiting example with reference to the annexed drawings.

In the drawings.

DETAILED DESCRIPTION

Figure 1:
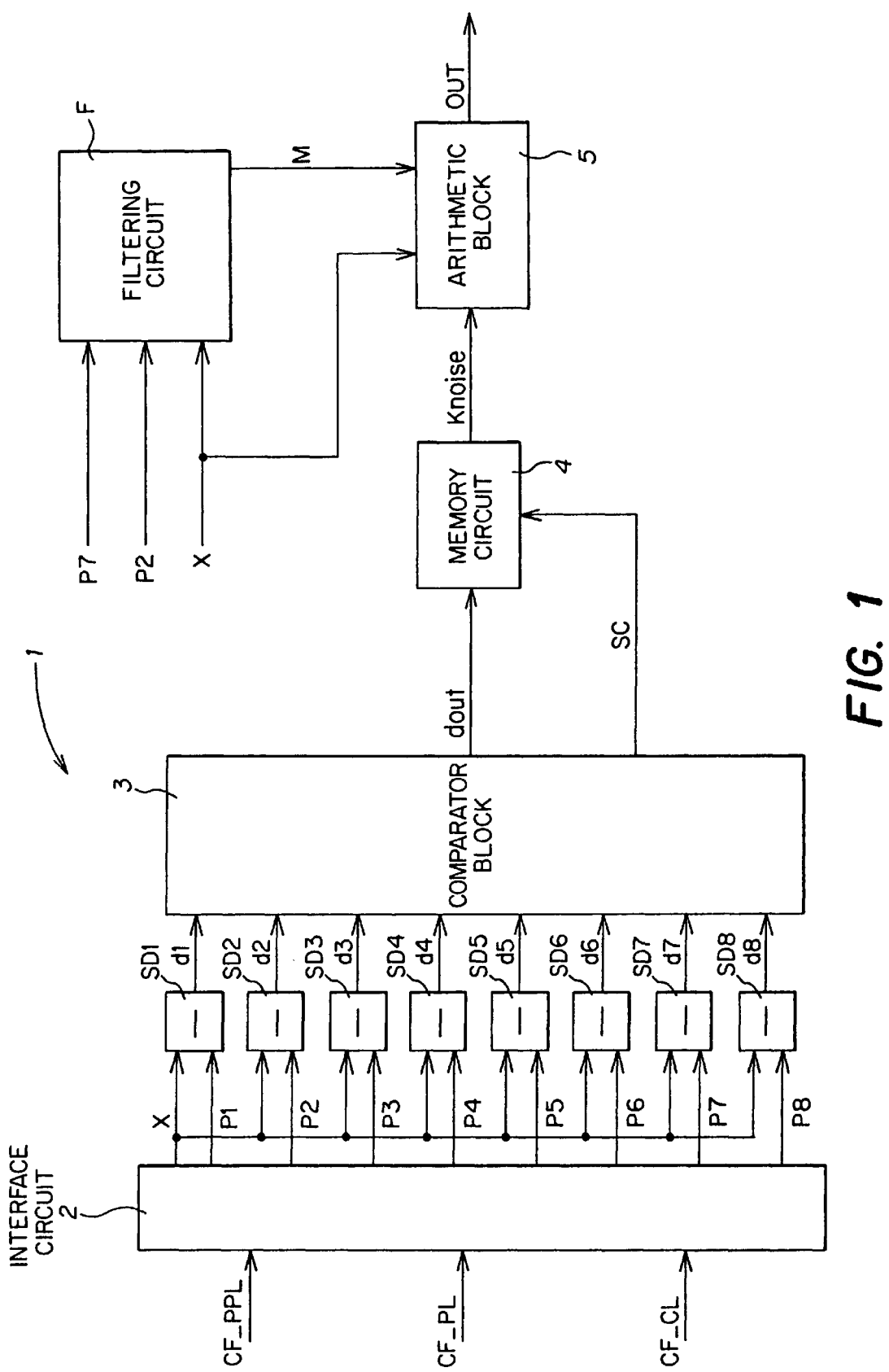
FIG. 1 shows a schematic view of a filter in accordance with an embodiment of the present invention.

FIG. 1 indicates schematically a filter 1 provided in accordance with an embodiment of the present invention, that achieves reduction of pulsed noise on video images in accordance with a fuzzy logic procedure.

Within this disclosure, an image field is defined as a group of lines constituting a video image in the same time interval.

As shown in FIG. 1 the filter 1 has at least three input terminals designed to receive digital signals for image lines consecutive in time CF_PPL, CF_PL, CF_CL of a current image field.

FIG. 1 shows that the filter 1 comprises an interface circuit 2 having first, second and a third input terminals coinciding with the input terminals of the filter 1, and a plurality of output terminals.

Figure 2:
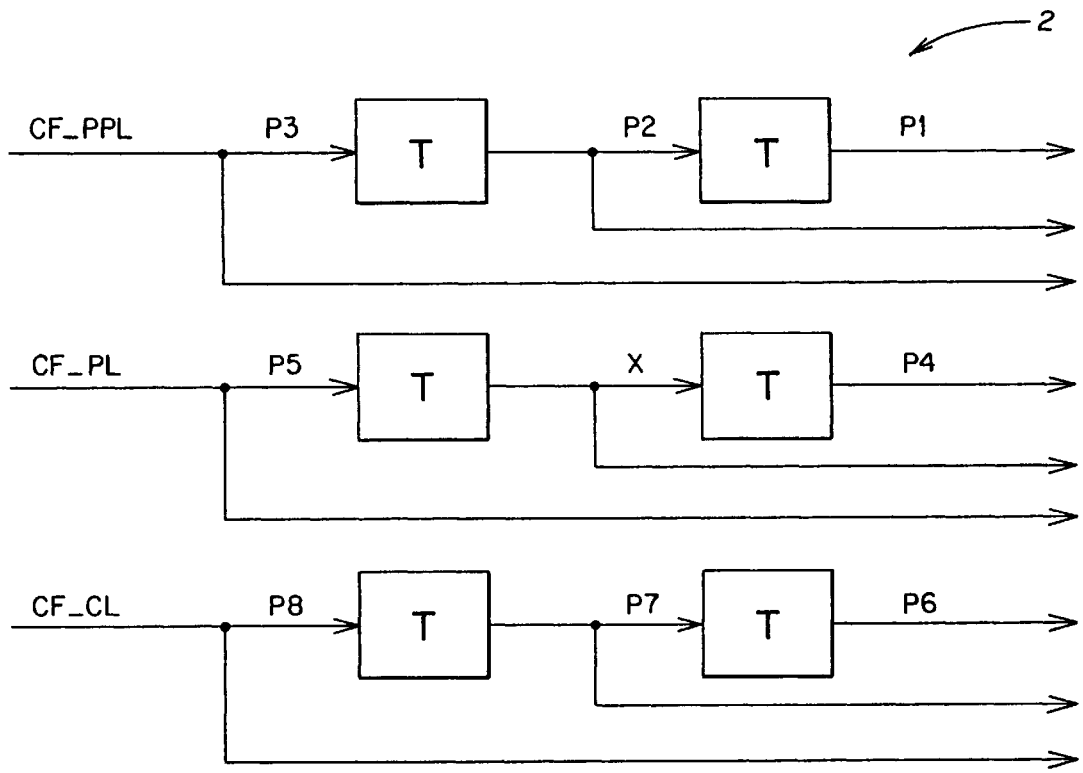
FIG. 2 shows a schematic view of an interface circuit of the filter of FIG. 1.

FIG. 2 shows in greater detail an embodiment of the internal structure of the interface circuit 2. In particular, FIG. 2 shows the interface circuit as comprising a plurality of delay blocks T which allow delaying of the digital signals present at the inputs of the filter 1 so as to create a working window 6 or image window shown in FIG. 3.

Specifically, this window 6 comprises nine digital signals. The digital signals included in the central line belong to the image line CF_PL while the digital signals included in the first and last lines belong to the image lines CF_PPL and CF_CL. The digital signal X in which the work signal is centered is the signal to be processed.

FIG. 1 also shows that the filter 1 comprises a plurality of digital subtractors SDi (i=1, . . . 8), each having a first and a second input terminal and an output terminal.

The first input terminal of each of the digital subtractors SDi is designed to receive the digital signal X to be processed, while the second input terminal of each of said subtractors SDi receives one of the remaining digital signals included in the image window. The digital subtractors SDi output a plurality of difference signals di, (i=1, . . . ,8). Each of the digital signals included in the image window is representative of the gray level associated with a so-called image pixel.

Consequently, each of the signals di represents the difference between the gray level associated with the image pixel to be processed and the gray level associated with an image pixel adjacent thereto.

A pixel may be considered as being affected by pulsed noise if the pixel's gray level is totally different from the gray level of the pixels adjacent thereto.

Figure 4:
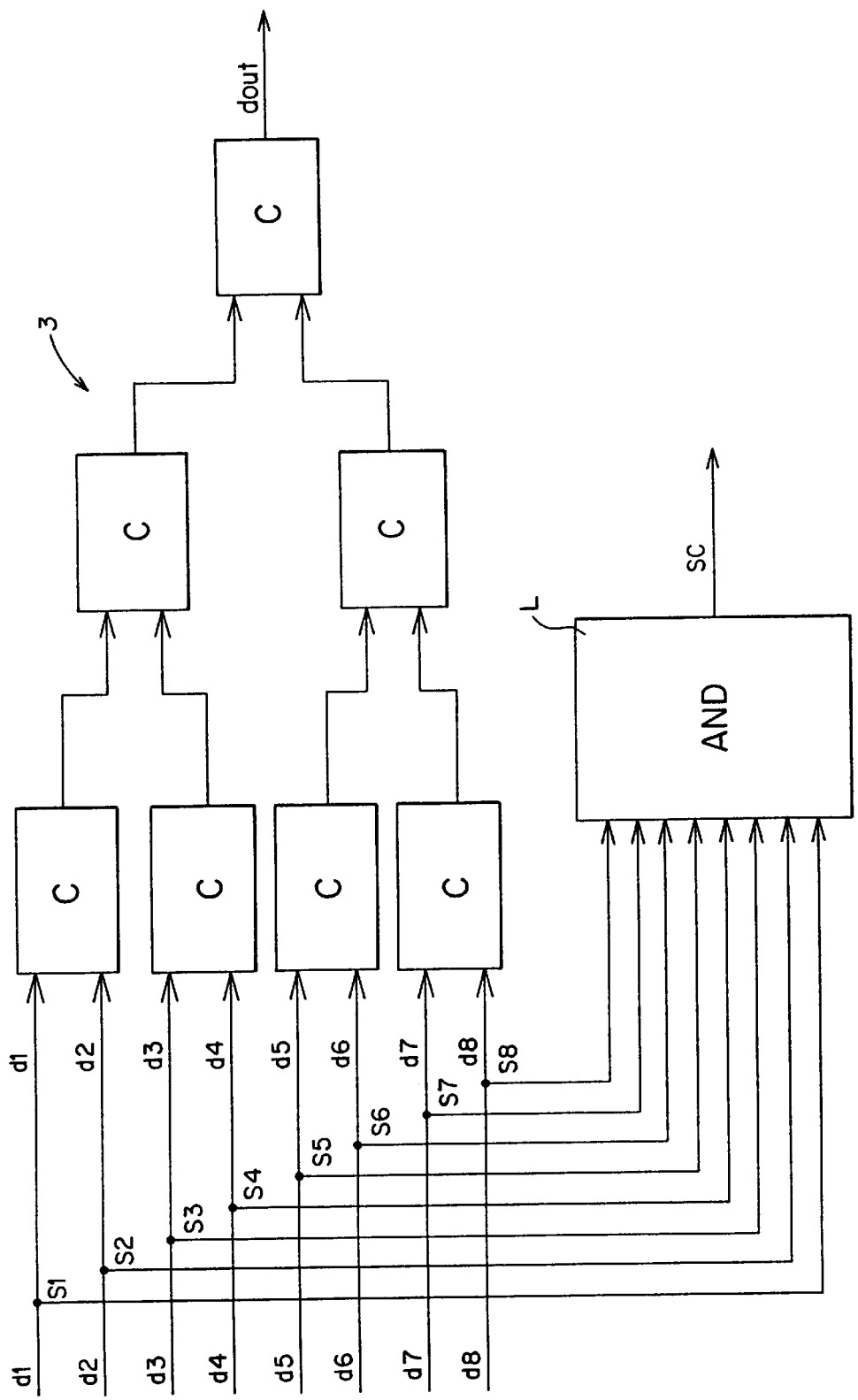
FIG. 4 shows a schematic view of a comparator block of the filter of FIG. 1.

As shown in FIG. 1, an embodiment of the filter 1 also comprises a comparator block 3. FIG. 4 shows the internal structure of an embodiment of the comparator block 3, which has a plurality of input terminals designed to receive the difference signals di, and first and second output terminals.

An embodiment of the comparator block 3 performs subsequent comparisons on said difference signals di by means of a plurality of comparator sub-blocks C connected together in cascade.

In this manner, the first output terminal of block 3 receives a difference signal dout coinciding with the one of the difference signals di which has a minimum modulus value.

Figure 3:
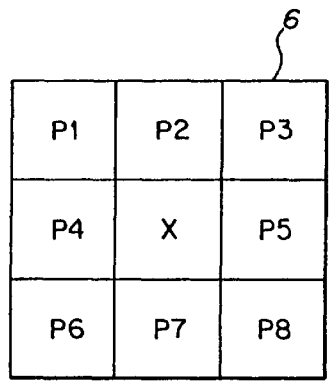
FIG. 3 shows schematically a so-called working window of the filter in accordance with an embodiment of the present invention.

In one embodiment, the difference signals di are coded with six bits, of which the most (or least) significant represents the sign of the difference signal. As shown in FIG. 3 the sign bits, indicated by Si, (i=1, . . . ,8), are sent to a plurality of inputs of a logic circuit L which is also incorporated in the comparator block 3.

Said logic circuit L is provided essentially through an AND logic port with eight inputs and is designed to generate a control signal SC which is received from the second output terminal of block 3. The signal SC can assume the logic values 0 and 1.

Again with reference to FIG. 1 the filter 1 comprises a memory circuit 4 having a first input terminal connected to the first output terminal dout of the comparator block 3 and an output terminal.

The memory circuit 4 also has an enablement input designed to receive the control signal SC present at the output of the logic circuit L.

With such an arrangement, if the control signal SC assumes value 0, i.e. the difference signals di do not all exhibit the same sign, then the pixel being processed is likely not affected by pulsed noise, because the gray level of the pixel is not totally different from the gray levels of the adjacent pixels. In such a case the pixel being processed is not filtered.

However, if the control signal SC assumes value 1, then the pixel being processed may or may not be affected by pulsed noise. If said pixel is affected by pulsed noise, then said pixel will be filtered.

The memory circuit 4 comprises a plurality of memory elements addressed through the value of dout and designed for storing the results achieved by executing off-line a fuzzy procedure, which is described below, to appraise in what measure the pixel being processed is affected or not by pulsed noise. Said results represent the values, within the interval [0,1], taken on by a parameter, Knoise, which is representative of the quantity of pulsed noise present in the pixel being processed.

Based on the type of noise considered, the values stored in the memory circuit 4 can be very small.

The filter 1 may also comprise an arithmetic block 5 having first, second and third input terminals and an output terminal coinciding with an output terminal of the filter 1.

There is also provided a filtering circuit F having first, second and third input terminals and an output terminal.

Specifically the first input terminal of the arithmetic block 5 is connected to the output terminal of the memory circuit 4 while the second and third input terminals of said arithmetic block 5 are connected to the third input terminal and the output terminal respectively of the filtering circuit F.

The input terminals of the circuit F are connected to output terminals of the interface circuit 2 so as to receive the digital signals P7, P2 and X respectively situated along a column of the image window.

An embodiment of the filtering circuit F employs a vertical median filter with three points of the conventional type, and is designed to organize the values of the signals present at its inputs and supply at an output a value indicated by M.

The arithmetic block 5 is designed to implement the following formula:

$$\text{OUT} = \text{Knoise} * M + (1 - \text{Knoise}) * X \tag{1}$$

Accordingly, if the parameter Knoise assumes the value 0 for the pixel being processed, the presence of pulsed noise is not detected and hence the digital signal X representing the gray level associated with said pixel remains unchanged at the output of the filter 1.

Conversely, if the parameter Knoise takes a value other than 0, the presence of pulsed noise in the pixel being processed and hence the output of the filter 1 is represented by the signal OUT obtained from the formula (1).

In particular if Knoise is equal to 1 the output of the filter 1 coincides with the output M of the filtering circuit F.

A filtering method in accordance with an embodiment of the present invention is described with reference to an initial state in which the digital signals for the consecutive image lines CF_PPL, CF_PL, CF_CL of the current image field are presented at the input of the interface circuit 2. The filtering method is essentially structured in accordance with two successive steps.

In the first step, a value of the parameter Knoise is detected by means of fuzzy logic procedures.

In the second step on the basis of the value of the parameter Knoise the filter 1 performs a soft switch between the original digital signal X representing the gray level associated with the pixel being processed and the output M of the filtering circuit F. This soft switch may be performed by the arithmetic block 5 implementing formula (1).

As mentioned above detection of the pulsed noise is performed by making use of a simulated off-line fuzzy procedure.

Specifically an embodiment of said fuzzy procedure is based on at least two so-called fuzzy logic inference rules of the type:

1) IF d1 is High Positive AND d2 is High Positive AND . . . AND d8 is High Positive THEN Knoise is High; ELSE Knoise is Low,
2) IF d1 is High Negative AND d2 is High Negative AND . . . AND d8 is High Negative THEN Knoise is HIGH; ELSE Knoise is Low.

As may be seen the antecedent part IF of each rule includes at least eight antecedent prepositions, each of which is represented by a difference signal di which may be calculated through the digital subtractors Sdi.

By stating the antecedent part of the rules this way all the data acquired from the digital signals included in the image window of FIG. 2A are considered in a single step of the fuzzy calculation.

Calculation of the antecedent part of the fuzzy rules through the comparator block 3 produces as a result a value for the digital signal dout.

This value is used for calculation of the consequent part of the fuzzy rules from which is obtained the corresponding value for the Knoise parameter. Modifications and changes can be made to the architecture and method in accordance with the present invention all however falling within the scope of the following claims.

Having thus described at least one illustrative embodiment of the invention, various alternations, modifications, and improvements will readily occur to those skilled in the art. Such alternations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. A filter for reducing pulsed noise in an image by using fuzzy logic, the filter comprising:
   an interface circuit, having an input that receives a plurality of digital signals of the image that are consecutive in time including a digital signal to be processed, and an output that provides an image window having the digital signal to be processed at a center of the image window;
   a plurality of subtractors, each having a first input that receives the digital signal to be processed, a second input that receives a respective one of the plurality of digital signals, and an output that provides a difference signal that represents a difference between the first input and the second input;
   a comparator block, having a plurality of inputs each coupled to the output of one of the plurality of subtractors, and an output that provides a result of a comparison performed on the plurality of differences;
   a memory circuit, coupled to the output of the comparator block, that stores values of a fuzzy logic parameter, an output that provides a selected one of the values of the fuzzy logic parameter based upon the result output from the comparator block;
   a filtering circuit, having a plurality of inputs that each receives one of a group of the plurality of digital signals, and an output that provides one of the plurality of digital signals based upon an organization of the plurality of digital signals received at the plurality of inputs of the filtering circuit; and
   an arithmetic block, having a first input coupled to the output of the memory circuit, and a second input that receives the digital signal to be processed, a third input coupled to the output of the filtering circuit, the arithmetic block performing a switch between the digital signal to be processed and the output of the filtering circuit based upon the selected value of the fuzzy logic parameter.

2. The filter of claim 1, wherein the comparator block includes:
   a first plurality of comparator sub-blocks, each having an input coupled to the output of one of the plurality of subtractors, and an output; and
   a second plurality of comparator sub-clocks, connected together and to the first plurality of comparator sub-blocks in a cascade arrangement;
   the first and second plurality of comparator sub-blocks being constructed and arranged to perform subsequent comparisons of the outputs of the plurality of subtractors to provide a difference signal having a minimal modulus.

3. The filter of claim 2 wherein the comparator block includes a logic block having a plurality of inputs, each of which is connected the output of a corresponding digital subtractor to receive a digital signal representing a sign bit of each of the difference signals, and an output that provides a control signal based upon a logical combination of the plurality of inputs.

4. The filter of claim 3 wherein the memory circuit includes an enable input that receives the control signal from the logic block.

5. The filter of claim 3 wherein the logic block includes an AND logic gate.

6. The filter of claim 4 wherein the memory circuit includes a plurality of memory elements corresponding to the values of the fuzzy logic parameter, and an input that receives the result output from the comparator block to select one of the plurality of memory elements to provide the selected one of the values of the fuzzy logic parameter.

7. A method for filtering pulsed noise within a video image, the video image including an image window that has a digital signal to be processed at a center of the image window, the image window being provided by an output of an interface circuit, the method further using an output of a filtering circuit, the method comprising the steps of:
   selecting a fuzzy logic parameter value based upon the digital signal to be processed;
   switching between the digital signal to be processed and the output of the filtering circuit based upon the value of the fuzzy logic parameter; and
   comparing the digital signal to be processed with other digital signals included in the image window, to generate a comparison result;
   wherein the step of selecting includes selecting the fuzzy logic parameter value based upon the comparison result.

8. The method of claim 7, wherein the step of comparing includes the steps, performed by the comparator block, of:
   receiving the output of the interface circuit through a plurality of subtractors; and
   comparing the digital signal to be processed with the output of the interface circuit that was received through the plurality of subtractors.

9. The method of claim 7, wherein the step of switching includes selecting a mathematical combination of the output of the filtering circuit, the digital signal to be processed, and the fuzzy logic parameter.

10. A method for reducing noise in an image, comprising the steps of:

comparing a parameter value of an input pixel of the image with a parameter value of a pixel adjacent to the input pixel in the image, to determine whether the input pixel will be filtered; and replacing the parameter value of the input pixel with a filtered value when the step of comparing determines that the input pixel will be filtered;

wherein the step of comparing includes comparing a gray level value of the input pixel with a gray level value of the pixel adjacent to the input pixel.

11. A method for reducing noise in an image, comprising the steps of:

comparing a parameter value of an input pixel of the image with a parameter value of a pixel adjacent to the input pixel in the image, to determine whether the input pixel will be filtered; and replacing the parameter value of the input pixel with a filtered value when the step of comparing determines that the input pixel will be filtered;

wherein:
the parameter value of the input pixel has a first sign;
the parameter value of the pixel adjacent to the input pixel has a second sign; and
the step of comparing includes determining whether the first sign is equal to the second sign, the step of comparing determining that the input pixel will not be filtered when the first sign is equal to the second sign.

12. A method for reducing noise in an image, comprising the steps of:

comparing a parameter value of an input pixel of the image with a parameter value of a pixel adjacent to the input pixel in the image, to determine whether the input pixel will be filtered;

replacing the parameter value of the input pixel with a filtered value when the step of comparing determines that the input pixel will be filtered; and determining a mathematical combination of the parameter value of the input pixel and a parameter value of each of at least one pixel adjacent to the input pixel, to provide the filtered value;

wherein the step of determining a mathematical combination includes determining a median value of:
the parameter value of the input pixel;
a parameter value of a first pixel that is adjacent to a first side of the input pixel; and
a parameter value of a second pixel that is adjacent to a second side of the input pixel that is opposite to the first side of the input pixel.

13. The method of claim 12, wherein the image includes a plurality of adjacent pixels, each of which is adjacent to the input pixel, and wherein the method further comprises the steps of:

subtracting the parameter value of the input pixel from each of a plurality of parameter values corresponding to the plurality of adjacent pixels, to provide a plurality of differences;

determining a minimum modulus value of the plurality of differences; and selecting a selected parameter based upon the minimum modulus value;

and wherein the step of determining a mathematical combination includes determining the filtered value to be equal to:

$K*M+(1-K)*X$; wherein:

X is the parameter value of the input pixel;
M is the median value; and
K is the selected parameter.

14. An apparatus for reducing noise in an image, comprising:

means for comparing a parameter value of an input pixel of the image with a parameter value of a pixel adjacent to the input pixel in the image, to determine whether the input pixel will be filtered; and means for replacing the parameter value of the input pixel with a filtered value when means for comparing determines that the input pixel will be filtered;

wherein the means for comparing includes means for comparing a gray level value of the input pixel with a gray level value of the pixel adjacent to the input pixel.

15. An apparatus for reducing noise in an image, comprising:

means for comparing a parameter value of an input pixel of the image with a parameter value of a pixel adjacent to the input pixel in the image, to determine whether the input pixel will be filtered; and means for replacing the parameter value of the input pixel with a filtered value when means for comparing determines that the input pixel will be filtered;

wherein:
the parameter value of the input pixel has a first sign;
the parameter value of the pixel adjacent to the input pixel has a second sign; and
the means for comparing includes means for determining whether the first sign is equal to the second sign, the means for comparing determining that the input pixel will not be filtered when the first sign is equal to the second sign.

16. An apparatus for reducing noise in an image, comprising:

means for comparing a parameter value of an input pixel of the image with a parameter value of a pixel adjacent to the input pixel in the image, to determine whether the input pixel will be filtered;

means for replacing the parameter value of the input pixel with a filtered value when means for comparing determines that the input pixel will be filtered; and means for determining a mathematical combination of the parameter value of the input pixel and a parameter value of each of at least one pixel adjacent to the input pixel, to provide the filtered value;

wherein the means for determining a mathematical combination includes means for determining a median value of:
the parameter value of the input pixel;
a parameter value of a first pixel that is adjacent to a first side of the input pixel;and
a parameter value of a second pixel that is adjacent to a second side of the input pixel that is opposite to the first side of the input pixel.

17. The apparatus of claim 16, wherein the image includes a plurality of adjacent pixels, each of which is adjacent to the input pixel, and wherein the apparatus further comprises:

means for subtracting the parameter value of the input pixel from each of a plurality of parameter values corresponding to the plurality of adjacent pixels, to provide a plurality of differences;

means for determining a minimum modulus value of the plurality of differences; and means for selecting a selected parameter based upon the minimum modulus value;

and wherein the means for determining a mathematical combination includes means for determining the filtered value to be equal to:

K*M+(1−K)*X; wherein:
- X is the parameter value of the input pixel;
- M is the median value; and
- K is the selected parameter.

18. A circuit for reducing noise in an image, comprising:

an input circuit having an input that receives a plurality of digital signals of the image including a digital signal to be processed, and an output that provides a comparison result of a plurality of comparisons between the digital signal to be processed and others of the plurality of digital signals;

a filtering circuit having an input that receives a group of the plurality of digital signals including the digital signal to be processed, and an output that provides a filtered result based upon the input of the filtering circuit; and an output circuit having a first input that receives the comparison result, a second input that receives the filtered result, and an output that provides a filtered signal to replace the digital signal to be processed based upon the comparison result and the filtered result.

19. The circuit of claim 18, wherein the plurality of digital signals includes a plurality of gray level values of a corresponding plurality of pixels of the image.

20. The circuit of claim 18, wherein each of the plurality of digital signals corresponds to a respective one of a plurality of pixels of the image, and wherein each of the others of the plurality of digital signals corresponds to one of a plurality of pixels adjacent to the pixel that corresponds to the digital signal to be processed.

21. The circuit of claim 18, wherein the output of the filtering circuit includes a median value of:
- the digital signal to be processed;
- a first digital signal of the plurality of digital signals; and
- a second digital signal of the plurality of digital signals.

22. The circuit of claim 21, wherein:
- each of the plurality of digital signals corresponds to a respective one of a plurality of pixels of the image;
- the first digital signal corresponds to a first pixel of the plurality of pixels that is adjacent to a first side of the pixel that corresponds to the digital signal to be processed; and
- the second digital signal corresponds to a second pixel of the plurality of pixels that is adjacent to a second side of the pixel that corresponds to the digital signal to be processed, the second side being opposite to the first side.

23. The circuit of claim 18, wherein the output circuit includes:

an arithmetic circuit having an input that receives the digital signal to be processed, a second input that receives the filtered result, a third input that receives a selection parameter, and an output that provides the filtered signal based upon a mathematical combination of the digital signal to be processed, the filtered result, and the selection parameter; and a memory circuit that stores a plurality of parameter values, the memory circuit having an input that receives the comparison result of the input circuit, and an output that provides the selection parameter to the arithmetic circuit based upon the comparison result.

24. The circuit of claim 23, wherein the mathematical combination is:

K*M+(1−K)*X; wherein:
- X is the digital signal to be processed;
- M is the filtered result; and
- K is the selection parameter.

25. The circuit of claim 18, wherein the input circuit includes:

a plurality of subtractors, each having a first input that receives the digital signal to be processed, a second input that receives a respective one of the plurality of digital signals, and an output that provides a difference signal that represents a difference between the first input and the second input;

a comparator block, having a plurality of inputs each coupled to the output of one of the plurality of subtractors, and an output that provides a first part of the comparison result based upon a minimum value of the plurality of differences;

a logic gate, having a plurality of inputs, each of which is connected the output of a corresponding digital subtractor to receive a digital signal representing a sign bit of each of the difference signals, and an output that provides a second part of the comparison result that is equal to an AND logic combination of the plurality of inputs.

26. The circuit of claim 25, wherein the output circuit includes:

an arithmetic circuit having an input that receives the digital signal to be processed, a second input that receives the filtered result, a third input that receives a selection parameter, and an output that provides the filtered signal based upon a mathematical combination of the digital signal to be processed, the filtered result, and the selection parameter; and a memory circuit that stores a plurality of parameter values, the memory circuit having an address input that receives the first part of the comparison result of the input circuit, an enable input that receives the second part of the comparison result, and an output that provides the selection parameter to the arithmetic circuit based upon the a parameter value selected by the comparison result when the enable input is active.

* * * * *

UNITED STATES PATENT AND TRADEMARK OFFICE
CERTIFICATE OF CORRECTION

PATENT NO. : 6,034,741
DATED : March 7, 2000
INVENTOR(S) : Laura Pennino, Rinaldo Poluzzi, Massimo Mancuso, Guido Rizzotto and Federico Travaglia It is certified that error appears in the above-identified patent and that said Letters Patent is hereby corrected as shown below:

Col. 3, line 15 should read:
 processed, while each of the second input terminal of each of said Col. 3, line 44 should read:
 sents the sign of the difference signal. As shown in FIG. 4

Col. 5, line 16 should read:
 window of FIG. 3 are considered in a single step of the Signed and Sealed this Fourteenth Day of November, 2000

Attest:

Q. TODD DICKINSON

*Attesting Officer*     *Director of Patents and Trademarks*